US012334901B2

(12) United States Patent
Kimura et al.

(10) Patent No.: US 12,334,901 B2
(45) Date of Patent: Jun. 17, 2025

(54) ELASTIC WAVE ELEMENT, LADDER FILTER, DEMULTIPLEXER, AND COMMUNICATION APPARATUS

(71) Applicant: KYOCERA Corporation, Kyoto (JP)

(72) Inventors: Toshiya Kimura, Kyotanabe (JP); Shigeyuki Kikuchi, Omiyahata (JP)

(73) Assignee: KYOCERA Corporation, Kyoto (JP)

( * ) Notice: Subject to any disclaimer, the term of this patent is extended or adjusted under 35 U.S.C. 154(b) by 228 days.

(21) Appl. No.: 18/017,786

(22) PCT Filed: Jul. 30, 2021

(86) PCT No.: PCT/JP2021/028287
§ 371 (c)(1),
(2) Date: Jan. 24, 2023

(87) PCT Pub. No.: WO2022/025235
PCT Pub. Date: Feb. 3, 2022

(65) Prior Publication Data
US 2023/0291384 A1 Sep. 14, 2023

(30) Foreign Application Priority Data
Jul. 30, 2020 (JP) ................................ 2020-129433

(51) Int. Cl.
*H03H 9/02* (2006.01)
*H03H 9/25* (2006.01)
*H03H 9/64* (2006.01)
*H04B 1/00* (2006.01)

(52) U.S. Cl.
CPC .......... *H03H 9/02574* (2013.01); *H03H 9/25* (2013.01); *H03H 9/6483* (2013.01); *H04B 1/0057* (2013.01)

(58) Field of Classification Search
CPC .... H03H 9/02574; H03H 9/25; H03H 9/6483; H03H 9/725; H04B 1/0057
USPC ......................................... 333/133, 193–196
See application file for complete search history.

(56) References Cited

U.S. PATENT DOCUMENTS

2014/0049340 A1 2/2014 Inque
2014/0210317 A1 7/2014 Tai et al.
2019/0036505 A1 1/2019 Akiyama et al.
2020/0091891 A1 3/2020 Geshi et al.
2020/0204146 A1 6/2020 Watanabe et al.
2020/0295735 A1 9/2020 Takata
(Continued)

FOREIGN PATENT DOCUMENTS

JP 2006-319679 A 11/2006
JP 2014-039199 A 2/2014
(Continued)

*Primary Examiner* — Jorge L Salazar, Jr.
(74) *Attorney, Agent, or Firm* — Volpe Koenig

(57) ABSTRACT

To achieve an elastic wave element with excellent electrical characteristics. An elastic wave resonator includes a piezoelectric substrate including a piezoelectric body and an IDT electrode, a support substrate, and a first intermediate layer. In the first intermediate layer, an atomic ratio of a metal element is larger than an atomic ratio of a metal element in the piezoelectric body, and an atomic ratio of oxygen is smaller than an atomic ratio of oxygen in the piezoelectric body. A thickness of the piezoelectric body is equal to or less than five times a maximum pitch of electrode fingers of the IDT electrode.

10 Claims, 8 Drawing Sheets

4
18
14
8
5
6
30
32
26
TD

(56) References Cited

U.S. PATENT DOCUMENTS

| | | | | |
|---|---|---|---|---|
| 2021/0152153 | A1 | 5/2021 | Kishino | |
| 2021/0234529 | A1* | 7/2021 | Uno | H03H 9/02559 |

FOREIGN PATENT DOCUMENTS

| | | | |
|---|---|---|---|
| JP | 2020-102768 | A | 7/2020 |
| WO | 2014/077213 | A1 | 5/2014 |
| WO | 2017/134980 | A1 | 8/2017 |
| WO | 2018/180418 | A1 | 10/2018 |
| WO | 2019/117106 | | 6/2019 |
| WO | 2019/198594 | A1 | 10/2019 |

* cited by examiner

ELASTIC WAVE ELEMENT, LADDER FILTER, DEMULTIPLEXER, AND COMMUNICATION APPARATUS

TECHNICAL FIELD

The present disclosure relates to an elastic wave element and the like.

BACKGROUND OF INVENTION

In the related art, a known elastic wave element includes an electrode provided on a substrate obtained by bonding a support substrate and a piezoelectric substrate. Such an elastic wave element is used, for example, as a band-pass filter in communication equipment. Patent Document 1 discloses an elastic wave element in which lithium niobate or lithium tantalate is used as a piezoelectric substrate and silicon, quartz, a ceramic, or the like is used as a support substrate.

CITATION LIST

Patent Literature

Patent Document 1: JP 2006-319679 A

SUMMARY

An elastic wave element according to an aspect of the present disclosure includes a piezoelectric substrate including a piezoelectric body and an IDT electrode with a plurality of electrode fingers arranged at predetermined pitches on the piezoelectric body, a support substrate located on a side opposite to the IDT electrode with respect to the piezoelectric substrate, and a first intermediate layer located between the piezoelectric substrate and the support substrate. In the first intermediate layer, a constituent element is identical to a constituent element of the piezoelectric body, an atomic ratio of a metal element is larger than an atomic ratio of a metal element in the piezoelectric body, and an atomic ratio of oxygen is smaller than an atomic ratio of oxygen in the piezoelectric body, and a thickness of the piezoelectric body is equal to or less than five times a maximum pitch among the predetermined pitches.

DESCRIPTION OF EMBODIMENTS

Figure 1:
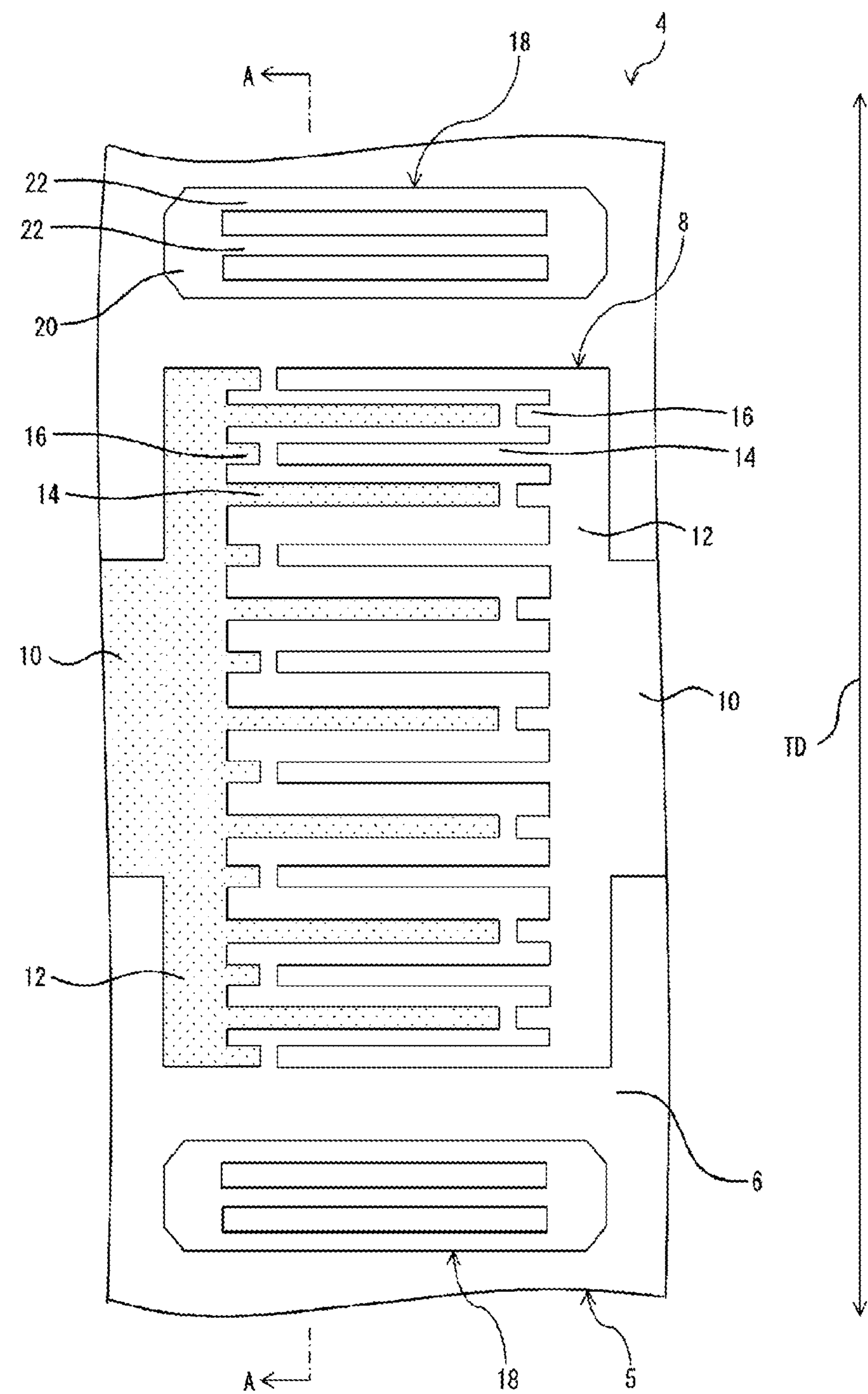
FIG. 1 is a schematic plan view of an elastic wave resonator according to a first embodiment of the present disclosure.

Embodiments according to the present disclosure will be described below with reference to the drawings. Note that the drawings used in the following description are schematic diagrams, and the dimension ratio of each member in the drawings is not strictly represented.

Configuration of Resonator

An elastic wave filter according to the present embodiment includes at least one elastic wave resonator. For example, the elastic wave filter constitutes a ladder filter by connecting a plurality of the elastic wave resonators in a ladder form. The elastic wave filter according to the present embodiment may include the plurality of elastic wave resonators in parallel in a direction orthogonal to a propagation direction of elastic waves in each of the elastic wave resonators.

Figure 2:
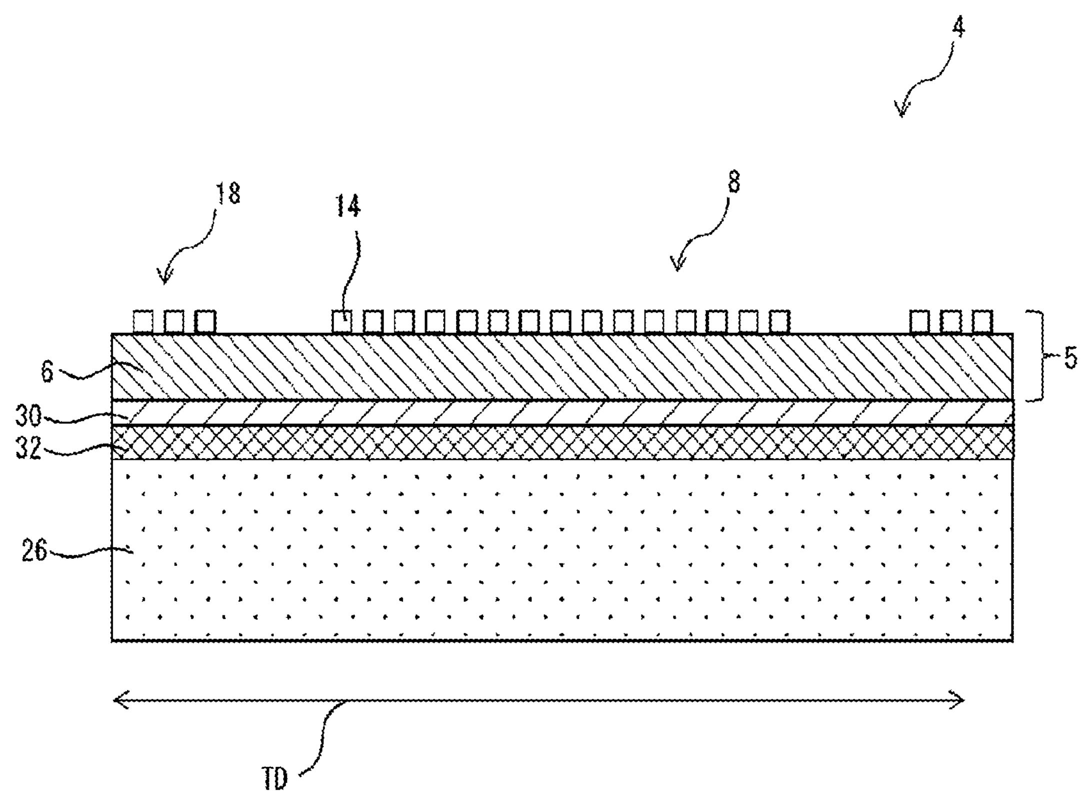
FIG. 2 is a schematic cross-sectional view of the elastic wave resonator and is a cross-sectional view taken along an arrow line A-A in FIG. 1.

Hereinafter, an elastic wave resonator 4 according to the present embodiment will be described in more detail with reference to FIGS. 1 and 2. FIG. 1 is a schematic plan view of the elastic wave resonator 4 according to the present embodiment. FIG. 2 is a schematic cross-sectional view of the elastic wave resonator 4 and is a cross-sectional view taken along an arrow line A-A in FIG. 1. In the present specification, a propagation direction TD of elastic waves in the elastic wave resonator 4 is defined as an up-down direction toward the face of the paper surface in plan view of the elastic wave resonator 4 including FIG. 1, and is defined as a right-left direction toward the paper surface in the cross-sectional view of the elastic wave resonator 4 including FIG. 2. In the present specification, in the cross-sectional views including FIG. 2 of the elastic wave resonator 4, only the members in the cross section are illustrated, while the members deeper than the cross section are not illustrated for the sake of simplicity of the drawings. The elastic wave resonator is an example of an elastic wave element.

As illustrated in FIGS. 1 and 2, the elastic wave resonator 4 according to the present embodiment includes a piezoelectric substrate 5. The piezoelectric substrate 5 includes a piezoelectric body 6 and an IDT electrode 8 on the piezoelectric body 6. In the cross-sectional views of the elastic wave resonator 4 of the present specification, including FIG. 2, the IDT electrode 8 is illustrated as being located on the top side with respect to the piezoelectric body 6 when viewed in a direction facing the paper surface.

The piezoelectric body 6 is made of a piezoelectric material, and may use, for example, a single crystal of lithium tantalate, lithium niobate, or the like. The piezoelectric body 6 includes a metal element and an oxygen element.

When a voltage is applied to an electrically conductive layer including the IDT electrode 8 described later in the elastic wave resonator 4, an elastic wave propagating through the piezoelectric body 6 in the propagation direction TD is excited. In the present embodiment, the piezoelectric body 6 may have a constant thickness as illustrated in FIG. 2. In the present specification, the expression "constant thickness" does not necessarily mean that the thickness is strictly constant, and a small amount of variation in the thickness is allowed within a range where the characteristics of the elastic wave propagating through the piezoelectric body 6 are not significantly affected. The thickness of the piezoelectric body 6 is preferably as thin as possible in order to reduce loss of electric signals and to reduce changes in characteristics due to temperature changes. In the present embodiment, the thickness of the piezoelectric body 6 is configured to be equal to or less than five times a maximum pitch among pitches at which electrode fingers 14 included in the IDT electrode 8 to be described below are arranged. The thickness of the piezoelectric body 6 is equal to or less than 2.5 times the wavelength of the elastic wave excited by the elastic wave resonator 4.

The IDT electrode 8 includes a pair of comb electrodes 10. In the present specification, in the plan views including FIG. 1 of the elastic wave resonator 4, one of the paired comb electrodes 10 is hatched to improve visibility. Each of the comb electrodes 10 includes a bus bar 12, a plurality of the electrode fingers 14 mutually extending from the bus bar 12, and a plurality of dummy electrodes 16 respectively projecting from the bus bar 12, between the plurality of electrode fingers 14. The pair of comb electrodes 10 are arranged in such a manner that the plurality of electrode fingers 14 intermesh with each other.

The bus bars 12 have a substantially constant width and are formed substantially along the propagation direction TD. The pair of bus bars 12 face each other in a direction substantially orthogonal to the propagation direction TD. The width of each of the bus bars 12 may be changed or the bus bars 12 may be formed inclined relative to the propagation direction TD, to the extent that the elastic wave propagating through the piezoelectric body 6 is not significantly affected.

Each of the electrode fingers 14 is formed in an elongated shape substantially along the width direction of the bus bar 12. In each of the comb electrodes 10, the electrode fingers 14 are arranged along the propagation direction TD. The electrode fingers 14 extending from one of the bus bars 12 and the electrode fingers 14 extending from the other one of the bus bars 12 are alternately arranged in the propagation direction TD.

The number of electrode fingers 14 is not limited to the number illustrated in FIG. 1, and may be appropriately designed in accordance with the characteristics required for the elastic wave resonator 4. The lengths of the electrode fingers 14 may be substantially constant as illustrated in FIG. 1, or the lengths may differ from each other in accordance with the position in the propagation direction TD, in other words, so-called apodization may be applied. Some of the electrode fingers 14 may be "thinned out" in part of the IDT electrode 8. In other words, a part of the IDT electrode 8 may include a region where some of the electrode fingers 14 are not formed.

The dummy electrodes 16 project substantially along the width direction of the bus bar 12. The dummy electrodes 16 projecting from one of the bus bars 12 face the tips of the electrode fingers 14 extending from the other one of the bus bars 12 with a gap interposed therebetween in a direction orthogonal to the propagation direction TD. The elastic wave resonator 4 need not include the dummy electrodes 16.

The elastic wave resonator 4 further includes a pair of reflectors 18 located at both ends with respect to the electrode fingers 14 in the propagation direction TD on the piezoelectric body 6. The reflectors 18 include a plurality of strip electrodes 22 extending from a pair of bus bars 20 facing each other. The reflectors 18 may be in an electrically floating state, or a reference potential may be applied to the reflectors 18. The IDT electrode 8 and the reflectors 18 may be formed in the same layer or may be contained in the electrically conductive layer. The IDT electrode 8 and the reflectors 18 are made of a metal material, and may be made of, for example, an alloy containing Al as a main constituent.

As illustrated in FIG. 2, the elastic wave resonator 4 further includes a support substrate 26 that is located on a side opposite to the IDT electrode 8 with respect to the piezoelectric substrate 5 and supports the piezoelectric substrate 5. In the present embodiment, the effect of the support substrate 26 on the characteristics of the elastic wave propagating through the piezoelectric body 6 is sufficiently small. Thus, the material and dimensions of the support substrate 26 may be appropriately designed. For example, the support substrate 26 includes an insulation material, and may include a resin or a ceramic (for example, sapphire). The support substrate 26 may also be made of Si. The support substrate 26 may have a thickness thicker than the thickness of the piezoelectric body 6, for example. The support substrate 26 may be made of a material having a linear expansion coefficient lower than the linear expansion coefficient of the piezoelectric body 6 in order to further reduce the influence of temperature changes on the characteristics of an elastic wave.

As illustrated in FIG. 2, the elastic wave resonator 4 includes a first intermediate layer 30 and a second intermediate layer 32 between the piezoelectric substrate 5 and the support substrate 26. More specifically, the elastic wave resonator 4 is formed by stacking the piezoelectric substrate 5, the first intermediate layer 30, the second intermediate layer 32, and the support substrate 26 in this order along the thickness direction of the elastic wave resonator 4.

As will be described below, the first intermediate layer 30 is a layer derived from an activated layer generated by performing an activation process for activating the surface of the piezoelectric body 6 of the piezoelectric substrate 5 when the piezoelectric substrate 5 and the support substrate 26 are bonded to each other. Therefore, the constituent element of the first intermediate layer 30 is the same or substantially the same as the constituent element of the piezoelectric body 6. "The constituent element of the first intermediate layer 30 is substantially the same as the constituent element of the piezoelectric body 6" means that a small amount of element other than the constituent element of the piezoelectric body 6 is included in the first intermediate layer 30 as an impurity. In the first intermediate layer 30, the atomic ratio of a metal element is larger than the atomic ratio of the metal element in the piezoelectric body 6, and the atomic ratio of oxygen is smaller than the atomic ratio of oxygen in the piezoelectric body. Thus, the first intermediate layer 30 has a lower resistivity than the piezoelectric body 6. For example, when the piezoelectric body 6 is made of lithium tantalate, the atomic ratio of tantalum in the first intermediate layer 30 is larger than the atomic ratio of tantalum in the piezoelectric body 6, the atomic ratio of oxygen in the first intermediate layer 30 is smaller than the atomic ratio of oxygen in the piezoelectric body 6, and the resistivity of the first intermediate layer 30 is lower than the resistivity of the piezoelectric body 6.

The second intermediate layer 32 is a layer derived from an activated layer generated by performing an activation process for activating a surface of the support substrate 26 when the piezoelectric substrate 5 and the support substrate 26 are bonded to each other. Therefore, the constituent element of the second intermediate layer 32 is the same or substantially the same as the constituent element of the support substrate 26. "The constituent element of the second intermediate layer 32 is substantially the same as the constituent element of the support substrate 26" means that a small amount of an element other than the constituent element of the support substrate 26 is included in the second intermediate layer 32 as an impurity. A thickness of the second intermediate layer 32 is larger than a thickness of the first intermediate layer 30. Thus, the strength of bonding between the piezoelectric body 6 and the support substrate 26 can be increased.

For the activation process used for forming the first intermediate layer 30 and the second intermediate layer 32, a normal temperature bonding apparatus (for example, a plasma processing apparatus or the like) used for bonding wafers in the related art can be used. The first intermediate layer 30 and the second intermediate layer 32 are layers obtained by amorphizing layers activated by the normal temperature bonding apparatus.

Figure 3:
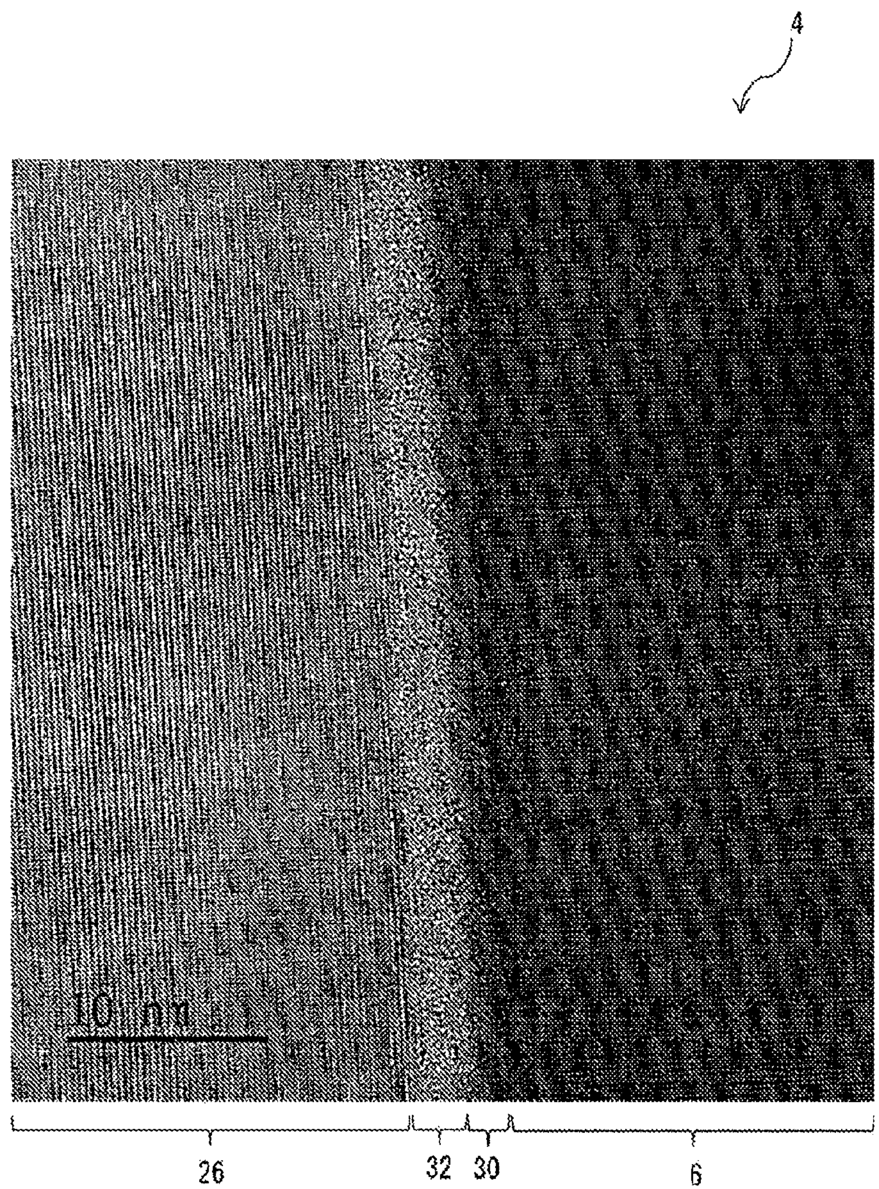
FIG. 3 is a TEM image showing an example of the elastic wave resonator.

FIG. 3 is a TEM image showing an example of a bonding surface between the piezoelectric body 6 and the support substrate 26 in the elastic wave resonator 4 manufactured by performing surface treatment on the piezoelectric body 6 and the support substrate 26 and bonding the piezoelectric body 6 and the support substrate 26.

In the example shown in FIG. 3, the first intermediate layer 30 with a thickness of about 1.2 nm and the second intermediate layer 32 with a thickness of about 3.0 nm are formed between the piezoelectric body 6 and the support substrate 26. When EDS analysis was performed on the elastic wave resonator 4 shown in FIG. 3, constituent elements of the piezoelectric body 6 and the first intermediate layer 30 were the same as each other. In the piezoelectric body 6, the atomic ratio of oxygen was 72.78% and the atomic ratio of tantalum was 23.98% in the EDS measurement, whereas in the first intermediate layer, the atomic ratio of oxygen was 47.44% and the atomic ratio of tantalum was 26.76% in the EDS measurement. From this result, it can be seen that the first intermediate layer 30 is a low-resistance layer having a lower electric resistivity than the piezoelectric body 6.

In the elastic wave resonator, the thickness of the piezoelectric body is desirably reduced in order to reduce the loss of signal intensity and improve low-temperature characteristics of the elastic wave resonator. The present inventors have found that when the thickness of the piezoelectric body is reduced, the resonance characteristics of the elastic wave resonator are affected by the state of an interface between the piezoelectric body and the support substrate. In addition, the present inventors have found that by controlling the state of the interface between the piezoelectric body and the support substrate, the influence of the state of the interface between the piezoelectric body and the support substrate on the resonance characteristics of the elastic wave resonator can be reduced and the electrical characteristics of a filter using the elastic wave resonator can be improved.

Specifically, in the elastic wave resonator 4 according to the present embodiment, when the thickness of the piezoelectric body 6 is equal to or less than five times the maximum pitch among the pitches of the electrode fingers 14, the above-described first intermediate layer 30 is formed between the piezoelectric body 6 and the support substrate 26. The present inventors have found that with this configuration, when a stop band of a parallel resonator including the elastic wave resonator 4 according to the present embodiment is located within a passband of the filter, the possibility of occurrence of spuriousness in the stop band can be reduced.

Figure 4:
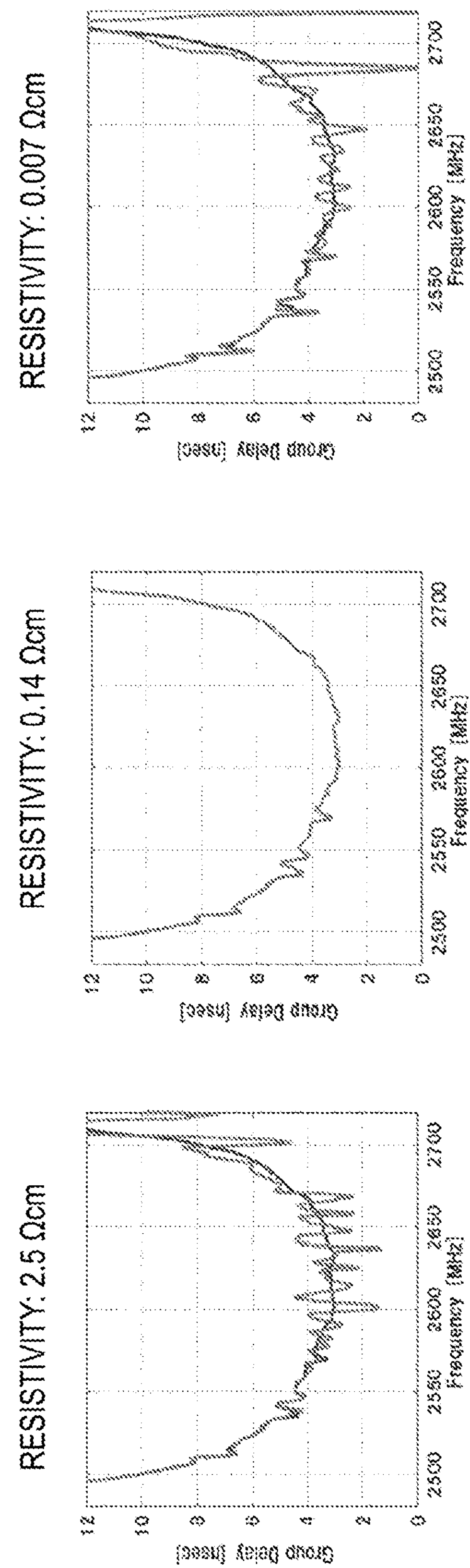
FIG. 4 is a diagram showing the effect of the elastic wave resonator.

FIG. 4 is a diagram showing the effect of the elastic wave resonator 4. FIG. 4 shows graphs obtained by simulating the characteristics of the filter when assuming that layers having resistivities of 2.5 Ωcm, 0.14 Ωcm, and 0.007 Ωcm and a thickness of 2 nm exist between the piezoelectric body 6 and the support substrate 26. In each graph shown in FIG. 4, the horizontal axis denotes frequency and the vertical axis denotes group delay. For reference, data for the resistivity of 0.14 Ωcm is also shown in the graphs for the resistivities of 2.5 Ωcm and 0.007 Ωcm.

As shown in FIG. 4, when the resistivity is 2.5 Ωcm, which is close to the value of the piezoelectric body 6, more ripples are generated than when the resistivity is 0.14 Ωcm. Even when a layer having a resistivity of 0.007 Ωcm, which is close to the resistivity of metal, exists between the piezoelectric body 6 and the support substrate 26, more ripples are generated than when a layer having a resistivity of 0.14 Ωcm exists.

Conversely, the generation of ripples can be reduced by providing a layer having a resistivity of 0.14 Ωcm, which is lower than the resistivity of the piezoelectric body 6, between the piezoelectric body 6 and the support substrate 26. In other words, when a layer having a lower resistance than the piezoelectric body 6 and a higher resistance than metal is formed between the piezoelectric body 6 and the support substrate 26, the generation of ripples in the elastic wave resonator 4 can be reduced.

Figure 5:
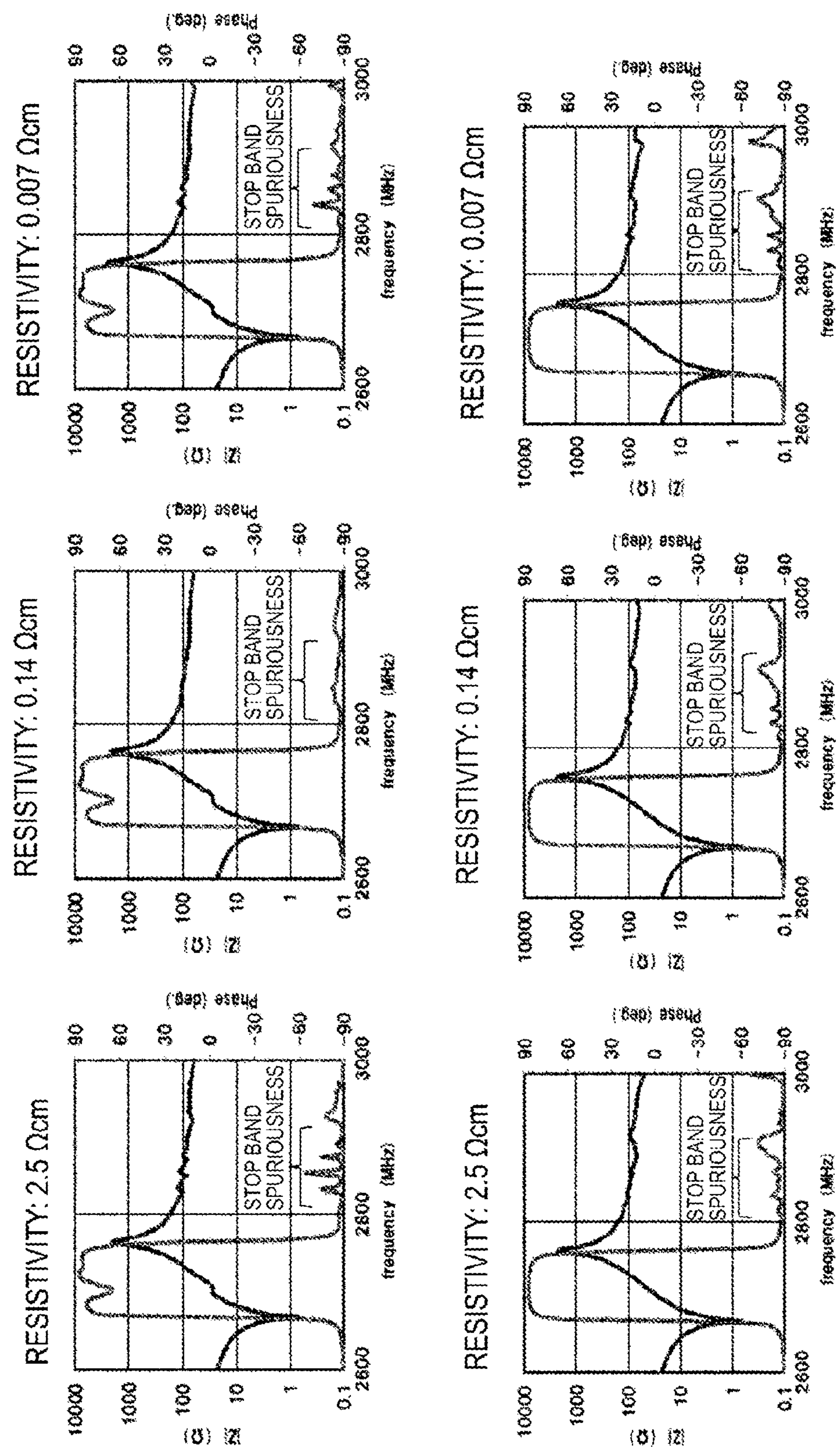
FIG. 5 is a graph showing the relationship between a thickness of a piezoelectric body of the elastic wave resonator and the occurrence of spuriousness in a stop band when the elastic wave resonator is used in a filter.

FIG. 5 shows graphs indicating the relationship between the thickness of the piezoelectric body 6 of the elastic wave resonator 4 and the occurrence of spuriousness in the stop band when the elastic wave resonator 4 is used in the filter. Each graph shown in the upper part of FIG. 5 is a graph when the thickness of the piezoelectric body 6 is 4.64 times the maximum pitch among the pitches of the electrode fingers 14. Each graph shown in the lower part of FIG. 5 is a graph when the thickness of the piezoelectric body 6 is 5.28 times the maximum pitch among the pitches of the electrode fingers 14. In each graph shown in FIG. 5, the horizontal axis denotes frequency, and the vertical axis denotes impedance on the left and denotes phase on the right. FIG. 5 also shows data when assuming that layers having resistivities of 2.5 Ωcm, 0.14 Ωcm, and 0.007 Ωcm and a thickness of 2 nm exist between the piezoelectric body 6 and the support substrate 26.

As shown in FIG. 5, when the thickness of the piezoelectric body 6 is 4.64 times the maximum pitch among the pitches of the electrode fingers 14 and a layer having a resistivity of 0.14 Ωcm, which is lower than the resistivity of the piezoelectric body 6, exists between the piezoelectric body 6 and the support substrate 26, it can be seen that the possibility of occurrence of spuriousness in the stop band is reduced. On the other hand, when the thickness of the piezoelectric body 6 is 4.64 times the maximum pitch among the pitches of the electrode fingers 14 and a layer having a resistivity of 2.5 Ωcm or 0.007 Ωcm exists between the piezoelectric body 6 and the support substrate 26, it can be seen that spuriousness occurs in the stop band. When the thickness of the piezoelectric body 6 is 5.28 times the maximum pitch among the pitches of the electrode fingers 14, it can be seen that spuriousness occurs in the stop band in all the graphs.

In the elastic wave resonator 4 according to the present embodiment, the resistivity of the first intermediate layer 30 is in the vicinity of 0.14 Ωcm. In other words, the above-described layer located between the piezoelectric body 6 and the support substrate 26 and having a resistivity of 0.14 Ωcm corresponds to the first intermediate layer 30 according to the present embodiment. Consequently, the first intermediate layer 30 existing between the piezoelectric body 6 and the support substrate 26 improves the characteristics of the elastic wave excited in the piezoelectric body 6.

Figure 6:
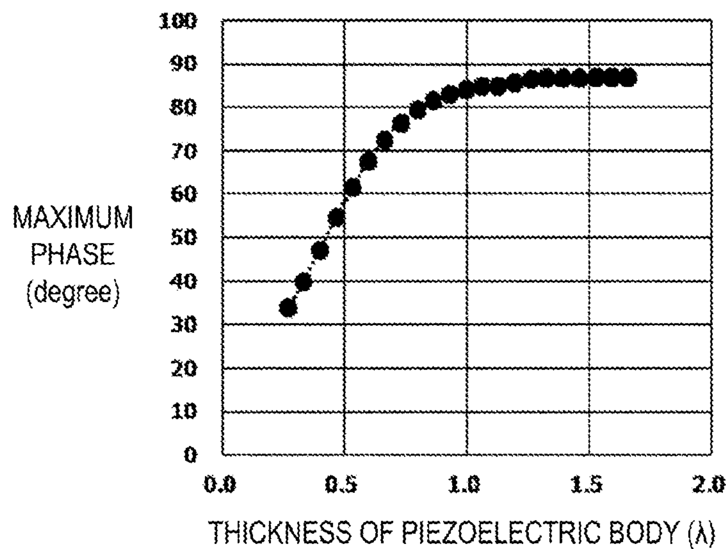
FIG. 6 is a graph showing the relationship between the thickness of the piezoelectric body and a maximum phase of the elastic wave resonator.

FIG. 6 is a graph showing the relationship between the thickness of the piezoelectric body 6 and a maximum phase of the elastic wave resonator. As shown in FIG. 6, when the thickness of the piezoelectric body 6 is 0.8 times the wavelength (A in FIG. 6) of the elastic wave excited in the piezoelectric substrate 5 (in other words, when the thickness is equal to or less than 1.6 times the maximum pitch among the pitches of the electrode fingers 14), it can be seen that the characteristics of the elastic wave resonator deteriorate. Conversely, by making the thickness of the piezoelectric body 6 larger than 0.8 times the wavelength of the elastic wave excited by the piezoelectric substrate 5 (in other words, larger than 1.6 times the maximum pitch among the pitches of the electrode fingers 14), the filter characteristics of the elastic wave resonator can be improved.

Figure 7:
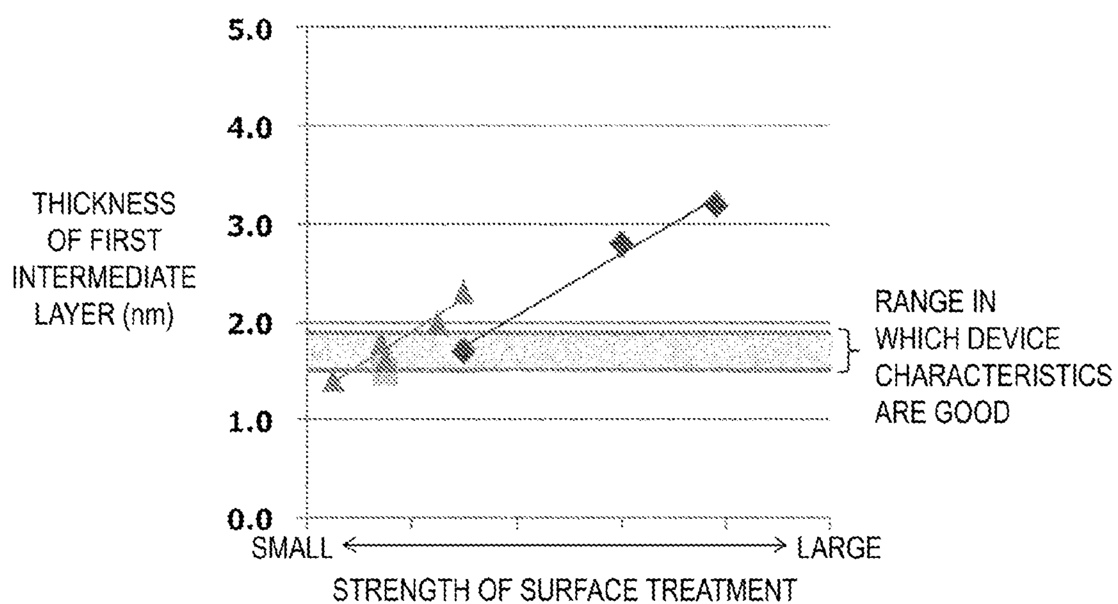
FIG. 7 is a graph showing the relationship between the strength of surface treatment when forming a first intermediate layer and a thickness of the first intermediate layer in an elastic wave resonator manufactured under predetermined conditions.

FIG. 7 is a graph showing the relationship between the strength of surface treatment when forming a first intermediate layer and a thickness of the first intermediate layer in elastic wave resonators manufactured under predetermined conditions. The plots indicated by the same marks in FIG. 7 indicate data obtained by irradiating an ion beam under the same conditions except for the intensity of the ion beam.

As shown in FIG. 7, it can be seen that the thickness of the first intermediate layer increases as the intensity of the ion beam increases. As a result of examining the characteristics of each manufactured elastic wave resonator, device characteristics were favorable when the thickness of the first intermediate layer is 1.5 to 1.9 nm (that is, from 1.5 nm to 1.9 nm). On the other hand, when the thickness of the first intermediate layer was less than 1.5, ripples were generated in filter characteristics, and even when the thickness of the first intermediate layer was greater than 1.9, device characteristics deteriorated because ripples were generated in the filter characteristics.

Figure 8:
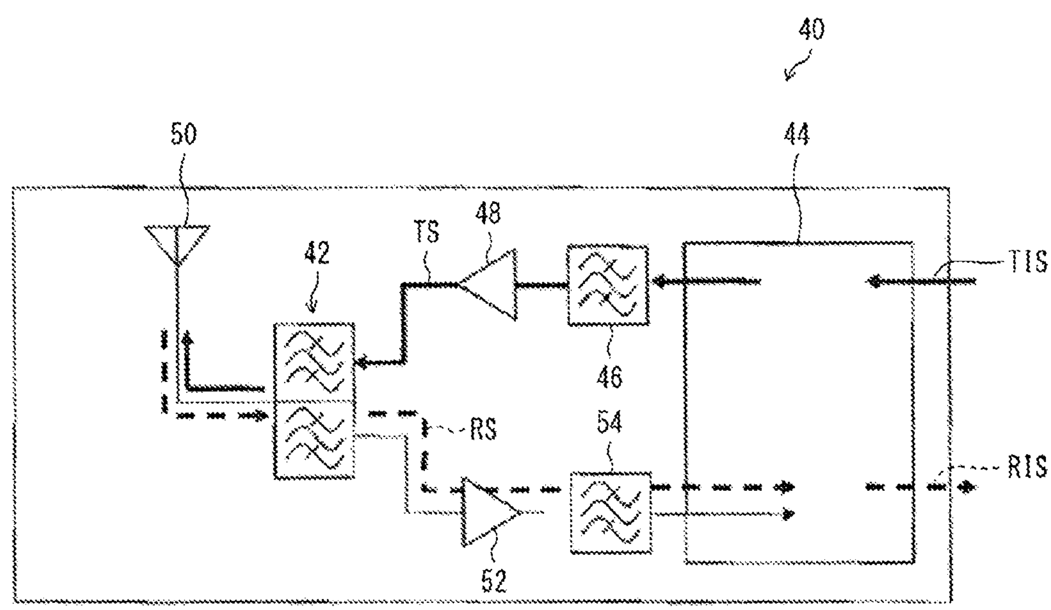
FIG. 8 is a schematic diagram for explaining a communication apparatus according to an embodiment of the present disclosure.

General Configuration of Communication Apparatus and Demultiplexer FIG. 8 is a block diagram illustrating main parts of a communication apparatus 40 according to an embodiment of the present disclosure. The communication apparatus 40 performs wireless communication using radio waves. A demultiplexer 42 has a function of demultiplexing a signal of a transmission frequency and a signal of a reception frequency in the communication apparatus 40.

In the communication apparatus 40, a transmission information signal TIS including information to be transmitted is subjected to modulation and an increase in frequency (conversion to a high-frequency signal of a carrier wave frequency) by an RF-IC 44 to become a transmission signal TS. The transmission signal TS is subjected to removal of unwanted components, which are components other than the components in the passband for transmission, by a band-pass filter 46, and is amplified by an amplifier 48 to be input to the demultiplexer 42. The demultiplexer 42 removes unwanted components, which are components other than the components in the passband for transmission, from the input transmission signal TS, and then outputs the transmission signal TS to an antenna 50. The antenna 50 converts the input electrical signal (transmission signal TS) to a wireless signal and transmits the converted signal.

In the communication apparatus 40, a radio signal received by the antenna 50 is converted to an electrical signal (reception signal RS) by the antenna 50 to be input to the demultiplexer 42. The demultiplexer 42 removes unwanted components, which are components other than the components in the passband for reception, from the input reception signal RS, and then outputs the converted signal to an amplifier 52. The output reception signal RS is amplified by the amplifier 52, and is subjected to the removal of unwanted components, which are components other than the components in the passband for reception, by a band-pass filter 54. Then, the reception signal RS is subjected to a decrease in frequency and demodulation by the RF-IC 44 to become a reception information signal RIS.

The transmission information signal TIS and the reception information signal RIS may each be a low-frequency signal (baseband signal) including appropriate information, and are, for example, an analog voice signal or a digitized voice signal. The passband of the wireless signal may be a passband in compliance with various standards such as Universal Mobile Telecommunications System (UMTS). The modulation scheme may be phase modulation, amplitude modulation, frequency modulation, or a combination of any two or more of these modulations.

Figure 9:
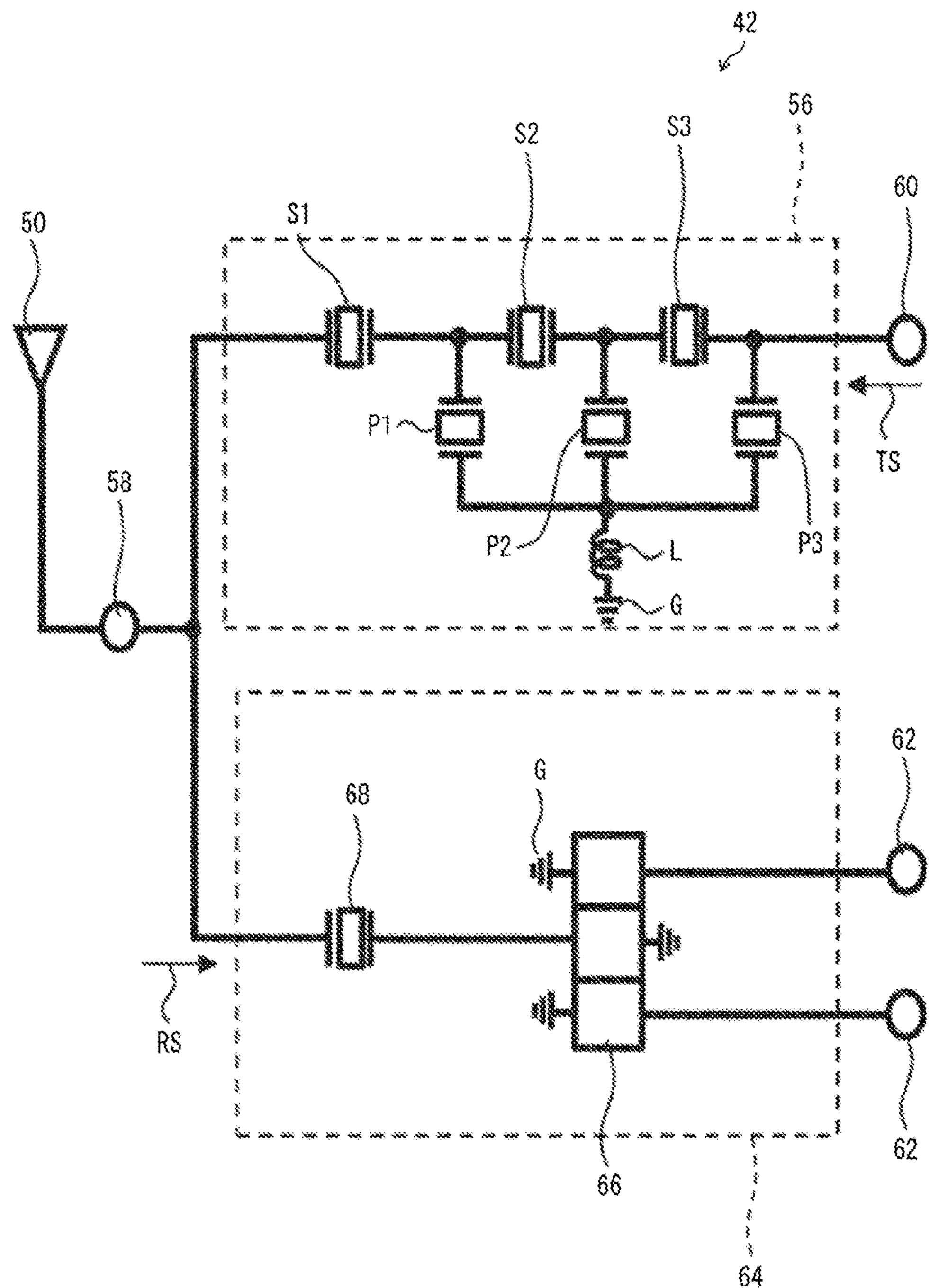
FIG. 9 is a circuit diagram for explaining a demultiplexer according to an embodiment of the present disclosure.

FIG. 9 is a circuit diagram illustrating the configuration of the demultiplexer 42 according to an embodiment of the present disclosure. The demultiplexer 42 is the demultiplexer 42 used in the communication apparatus 40 in FIG. 8.

A transmission filter 56 includes series resonators S1 to S3 and parallel resonators P1 to P3 as illustrated in FIG. 9. The demultiplexer 42 is mainly constituted of an antenna terminal 58, a transmission terminal 60, a reception terminal 62, the transmission filter 56 disposed between the antenna terminal 58 and the transmission terminal 60, and a reception filter 64 disposed between the antenna terminal 58 and the reception terminal 62. The transmission signal TS from the amplifier 48 is input to the transmission terminal 60, and the transmission signal TS input to the transmission terminal 60 is subjected to removal of unwanted components (in other words, filtering), which are components other than the components in the passband for transmission, by the transmission filter 56, and is output to the antenna terminal 58. The reception signal RS from the antenna 50 is input to the antenna terminal 58, and is subjected to removal of unwanted components (in other words, filtering), which are components other than the components in the passband for reception, by the reception filter 64, and is output to the reception terminal 62.

The transmission filter 56 is constituted by, for example, a ladder elastic wave filter. Specifically, the transmission filter 56 includes three series resonators S1, S2, and S3 connected in series between the input side and the output side of the filter, and three parallel resonators P1, P2, and P3 provided between series arms which are wires for connecting the series resonators to one another, and a reference potential portion G. That is, the transmission filter 56 is a three-stage ladder filter. However, the number of stages of the ladder filter in the transmission filter 56 is optional.

An inductor L is provided between the parallel resonators P1 to P3 and the reference potential portion G. By setting the inductance of the inductor L to a predetermined magnitude, an attenuation pole is formed outside the passband of the transmission signal to increase out-of-band attenuation. A plurality of the series resonators S1 to S3 and a plurality of the parallel resonators P1 to P3 are each made of an elastic wave resonator.

The reception filter 64 includes, for example, a multi-mode elastic wave filter 66, and an auxiliary resonator 68 connected in series to the input side of the multi-mode elastic wave filter 66. In the present embodiment, the multi-mode includes a double mode. The multi-mode elastic wave filter 66 has a balanced-unbalanced conversion function, and the reception filter 64 is connected to two reception terminals 62, to which balanced signals are output. The reception filter 64 is not limited to being constituted by the multi-mode elastic wave filter 66, and may be constituted by a ladder filter, or may be a filter that does not have a balanced-unbalanced conversion function.

A circuit for impedance matching including an inductor or the like may be inserted between a connection point of the transmission filter 56, the reception filter 64 and the antenna terminal 58, and the ground potential portion G.

The elastic wave filter according to each of the embodiments described above is, for example, an elastic wave element constituting at least one ladder filter circuit of the transmission filter 56 or the reception filter 64 in the demultiplexer 42 illustrated in FIG. 8, for example. When any of the transmission filter 56 or the reception filter 64 is the elastic wave filter according to each of the embodiments described above, all or at least some of the elastic wave resonators included in the filter are the elastic wave resonators 4 described above. In the elastic wave filter according to each of the embodiments described above, the stop band of at least one parallel resonator is located within the passband of the ladder filter.

By adopting the demultiplexer 42 including the transmission filter 56 or the reception filter 64 described above, the filter characteristics of the communication apparatus 40 may be improved.

The present disclosure is not limited to each of the embodiments described above, and various modifications can be made within the scope indicated by the claims, and an embodiment obtained by appropriately combining technical means disclosed in different embodiments is also included in a technical scope of the present disclosure.

REFERENCE SIGNS

4 Elastic wave resonator (elastic wave element)
5 Piezoelectric substrate
6 Piezoelectric body
8 IDT electrode
14 Electrode finger
26 Support substrate
30 First intermediate layer
32 Second intermediate layer
40 Communication apparatus
42 Demultiplexer
44 RF-IC
50 Antenna
56 Transmission filter
58 Antenna terminal
64 Reception filter

The invention claimed is:

1. An elastic wave element comprising:
a piezoelectric substrate comprising a piezoelectric body and an interdigital transducer (IDT) electrode with a plurality of electrode fingers arranged at predetermined pitches on the piezoelectric body;
a support substrate located on a side opposite to the IDT electrode with respect to the piezoelectric substrate;
a first intermediate layer located between the piezoelectric substrate and the support substrate;
a second intermediate layer located between the first intermediate layer and the support substrate and comprising a constituent element substantially the same to a constituent element of the support substrate, wherein
in the first intermediate layer, a constituent element is substantially the same as a constituent element of the piezoelectric body, an atomic ratio of a metal element is larger than an atomic ratio of a metal element in the piezoelectric body, and an atomic ratio of oxygen is smaller than an atomic ratio of oxygen in the piezoelectric body,
a thickness of the piezoelectric body is equal to or less than five times a maximum pitch among the predetermined pitches, and
a thickness of the second intermediate layer is larger than a thickness of the first intermediate layer.

2. The elastic wave element according to claim 1, wherein
the thickness of the piezoelectric body is larger than 1.6 times the predetermined pitches.

3. A ladder filter comprising at least one of the elastic wave elements according to claim 1, wherein
a stop band of at least one parallel resonator is located within a passband of the ladder filter.

4. A demultiplexer comprising:
an antenna terminal;
a transmission filter configured to filter a transmission signal and output the filtered transmission signal to the antenna terminal; and
a reception filter configured to filter a reception signal from the antenna terminal, wherein
at least one of the transmission filter and the reception filter comprises the ladder filter according to claim 3.

5. A communication apparatus comprising:
an antenna;
the demultiplexer according to claim 4, comprising the antenna terminal connected to the antenna; and
an IC connected to the transmission filter and the reception filter.

6. An elastic wave element comprising:
a piezoelectric substrate comprising a piezoelectric body and an interdigital transducer (IDT) electrode with a plurality of electrode fingers arranged at predetermined pitches on the piezoelectric body;
a support substrate located on a side opposite to the IDT electrode with respect to the piezoelectric substrate; and
a first intermediate layer located between the piezoelectric substrate and the support substrate, wherein
in the first intermediate layer, a constituent element is substantially the same as a constituent element of the piezoelectric body, an atomic ratio of a metal element is larger than an atomic ratio of a metal element in the piezoelectric body, and an atomic ratio of oxygen is smaller than an atomic ratio of oxygen in the piezoelectric body,
a thickness of the piezoelectric body is equal to or less than five times a maximum pitch among the predetermined pitches, and
the thickness of the first intermediate layer is 1.5 to 1.9 nm.

7. The elastic wave element according to claim 6, wherein
the thickness of the piezoelectric body is larger than 1.6 times the predetermined pitches.

8. A ladder filter comprising at least one of the elastic wave elements according to claim 6, wherein
a stop band of at least one parallel resonator is located within a passband of the ladder filter.

9. A demultiplexer comprising:

an antenna terminal;

a transmission filter configured to filter a transmission signal and output the filtered transmission signal to the antenna terminal; and a reception filter configured to filter a reception signal from the antenna terminal, wherein at least one of the transmission filter and the reception filter comprises the ladder filter according to claim 8.

10. A communication apparatus comprising:

an antenna;

the demultiplexer according to claim 9, comprising the antenna terminal connected to the antenna; and an IC connected to the transmission filter and the reception filter.

* * * * *